United States Patent
Cicalini

(10) Patent No.: US 8,072,255 B2
(45) Date of Patent: Dec. 6, 2011

(54) QUADRATURE RADIO FREQUENCY MIXER WITH LOW NOISE AND LOW CONVERSION LOSS

(75) Inventor: Alberto Cicalini, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 12 days.

(21) Appl. No.: 11/970,311

(22) Filed: Jan. 7, 2008

(65) Prior Publication Data

US 2009/0174459 A1    Jul. 9, 2009

(51) Int. Cl.
*G06G 7/12* (2006.01)
(52) U.S. Cl. ......... 327/355; 327/113; 327/114; 327/356
(58) Field of Classification Search .............. 327/113, 327/114, 355–357; 370/342, 320, 310, 319; 455/315, 318, 319
See application file for complete search history.

(56) References Cited

U.S. PATENT DOCUMENTS

| | | | |
|---|---|---|---|
| 5,850,598 | A | 12/1998 | Behrent |
| 5,999,804 | A | 12/1999 | Forgues |
| 6,191,623 | B1 * | 2/2001 | Gabara ............................ 327/71 |
| 6,512,408 | B2 | 1/2003 | Lee et al. |
| 7,483,687 | B2 * | 1/2009 | Carrez ........................... 455/318 |
| 2007/0224964 | A1 * | 9/2007 | Kwon et al. ................... 455/326 |
| 2007/0230558 | A1 * | 10/2007 | Sjoland et al. ................. 375/235 |
| 2008/0009259 | A1 * | 1/2008 | Chang et al. ................... 455/318 |
| 2008/0014896 | A1 * | 1/2008 | Zhuo et al. ..................... 455/326 |
| 2008/0284487 | A1 * | 11/2008 | Pullela et al. .................. 327/355 |

OTHER PUBLICATIONS

Lee, Thomas H., "The Design of CMOS Radio-Frequency Integrated Circuits," Stanford University, Cambridge University Press, 1998.
Weisman, Carl J., "The Essential Guide to RF and Wireless," Prentice Hall PTR, Upper Saddle River, NJ, 2000.
Liapine, A., "Resonant Cavities as Beam Position Monitors, Part 3 Analog Signal Processing Laboratory Measurements," www.hep.ucl.ac.uk/~liapine/part_three_analog_signal_processing.doc.
International Search Report and Written Opinion—PCT/US2009/030234, International Search Authority—European Patent Office—Jan. 20, 2010.

* cited by examiner

*Primary Examiner* — Lincoln Donovan
*Assistant Examiner* — Brandon Cole
(74) *Attorney, Agent, or Firm* — Larry J. Moskowitz

(57) ABSTRACT

In one embodiment of the invention, a method for convolution of signals is disclosed including generating four phased half duty cycle clocks each being out of phase by a multiple of ninety degrees from the others; coupling the four phased half duty cycle clocks into a four phase half duty cycle mixer; and switching switches in the four phase half duty cycle mixer in response to the four phased half duty cycle clocks to convolve a differential input signal with the four phased half duty cycle clocks to concurrently generate a differential in-phase output signal and a differential quadrature-phase output signal on a dual differential output port.

20 Claims, 17 Drawing Sheets

(BACKGROUND)

QUADRATURE RADIO FREQUENCY MIXER WITH LOW NOISE AND LOW CONVERSION LOSS

FIELD

The embodiments of the invention relate generally to radio transmitters and radio receivers. More particularly, the embodiments of the invention relate to radio frequency (RF) mixers.

BACKGROUND

A radio frequency (RF) mixer is generally a three-port radio frequency component that is used to change the frequency of one of the input signals. In a radio transmitter, an RF mixer may also be referred to as an upconverter. When used in a radio receiver, an RF mixer may also be referred to as a downconverter.

An RF mixer may be an active component or a passive component. To achieve a small scale size, an RF mixer typically uses an active component formed of transistors receiving a power supply so that it may be integrated into integrated circuits with other radio frequency components and devices.

Referring now to background FIG. 1, a schematic symbol for an RF mixer 100 is illustrated. The mixer 100 has two inputs ports LO, IF/RF and one output port RF/IF. If being used as an upconverter, the input ports are local oscillating input port LO and intermediate frequency input port IF and the output port is radio frequency output port RF. If the mixer is being used as a down converter, the input ports are a local oscillating input port LO and a radio frequency input port RF, and the output port is an intermediate frequency output port IF. The LO port receives a local oscillating signal from an oscillating signal source.

The purpose of a mixer is to change the frequency of a signal while hopefully keeping everything else about the signal the same. In FIG. 1, a first signal is coupled into the IF/RF port of the mixer 100 at particular frequency $f_1$. A carrier signal is coupled into the LO port of the mixer 100 at a second frequency ($f_2$). Two different output signals are formed at the RF/IF output port of the mixer 100 that may be selectively used. For upconversion to a higher frequency output signal, the in-phase output signal with a frequency equal to the sum of the two input frequencies ($f_1+f_2$) is selected. For downconversion to a lower frequency output signal, the output signal with a frequency equal to the difference between the two input frequencies ($f_1-f_2$) is selected.

For example, sound waves of voice are in a low frequency range of 20 to 20,000 hertz. On the other hand, carrier frequencies of cellular communications systems are in much higher frequency bands, such as 900,000,000 hertz. To talk on a cellular phone, for example, the voice frequency needs to be upconverted to the cellular carrier frequency used in cellular communications. One or more mixers are used to change the frequency band or range of human voice to the frequency band of the cellular carrier frequency.

One important characteristic of a mixer is conversion gain. Conversion gain is the ratio of the amplitude of the output signal to the amplitude of the input signal (not the local oscillating LO signal). Conversion gain may be expressed as a power ratio. If the conversion gain is less than one, a fraction, there is actually a loss through the mixer.

Another important characteristic of a mixer is its noise figure (NF). The noise figure for a mixer is determined by dividing the signal-to-noise ratio (SNR) at the input port (not the local oscillating LO input port) by the signal-to-noise ratio (SNR) at the output port of the mixer and converting the ratio into decibels.

Thus, a mixer can be improved by increasing the conversion gain and reducing the noise figure. By increasing the conversion gain and reducing the noise figure in a mixer, the requirements for other RF components may be more relaxed leading to simpler designs using less integrated circuit die area and possibly power conserving designs with the amplification of less noise.

BRIEF SUMMARY

The embodiments of the invention are summarized by the claims that follow below.

BRIEF DESCRIPTIONS OF THE DRAWINGS

DETAILED DESCRIPTION

In the following detailed description of the embodiments of the invention, numerous specific details are set forth in order to provide a thorough understanding of the present invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

Introduction

The embodiments of the invention include a method, apparatus and system for a balanced fifty percent duty cycle mixer with a transfer function providing low noise and low conversion loss.

A 25% duty cycle mixer generates very little noise and has a low conversion loss, both of which are desirable qualities in RF mixers. However, a 25% duty cycle mixer suffers from having a very stringent requirement of rise time and fall time of the signal on the local oscillator port. Additionally, it's very difficult to generate a well controlled set of four 25% duty cycle rectangular waveforms for operation of a 25% duty cycle mixer.

Thus, it is desirable to design a mixer that operates with square waveforms having a 50% duty cycle with an internally generated transfer function of a 25% duty cycle mixer to achieve low noise and low conversion loss.

Four Phase Half Duty Cycle Mixer System

Figure 1:
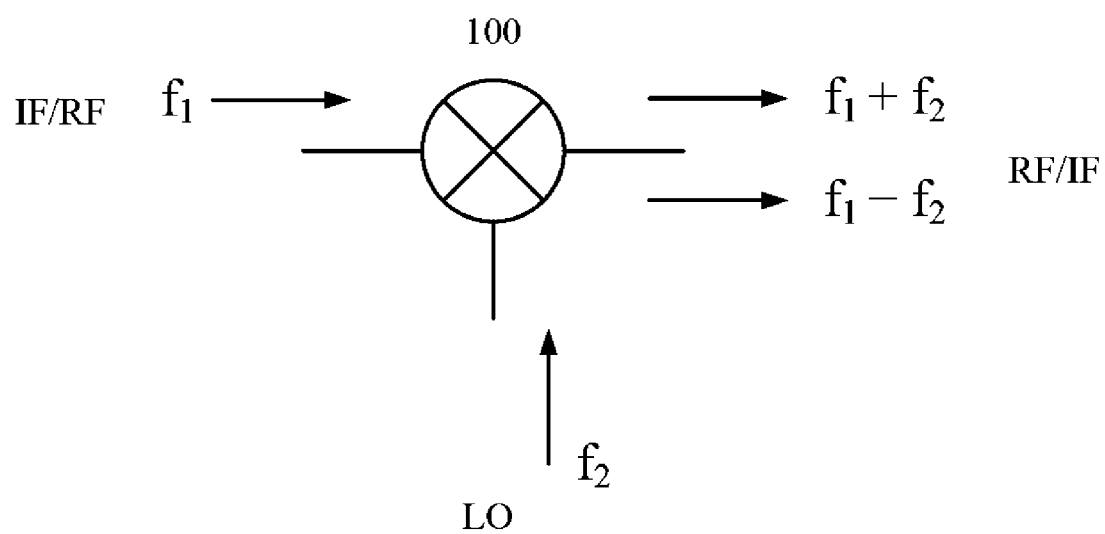
FIG. 1 is a background figure illustrating a schematic symbol of a radio frequency mixer.
Figure 2A:
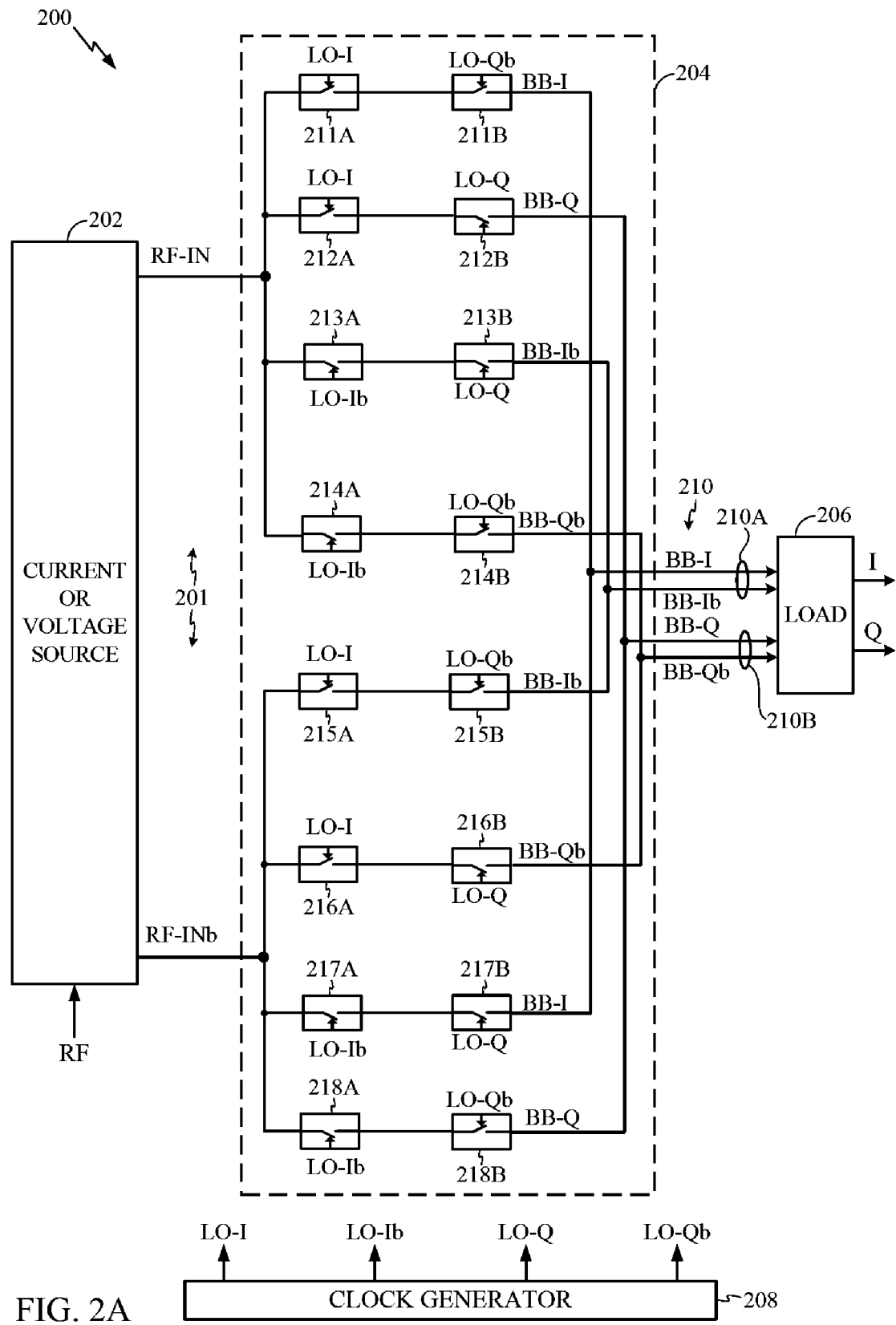
FIG. 2A is a functional block diagram of a first embodiment of a four phase half (50%) duty cycle quadrature mixer system.

Referring now to FIG. 2A, a functional block diagram of a first embodiment of a four phase half (50%) duty cycle quadrature mixer system 200 is illustrated.

The quadrature mixer system 200 includes a quadrature mixer 204. The mixer system 200 further includes an electrical (e.g., current or voltage) differential signal source 202, a first embodiment of a four phase half (50%) duty cycle quadrature mixer 204, a dual differential electrical (e.g., current or voltage respectively) load 206, and a four phase clock generator or local oscillator 208 coupled together as shown. In an integrated circuit, conductive traces in one or more layers may be used to couple the elements of the system together. The four phase half duty cycle quadrature mixer 204 may also be referred to as a series-parallel double balanced switching mixer.

The electrical (e.g., current or voltage) differential signal source 202 provides a differential current or voltage signal on RF-IN and RF-INb that is proportional to an RF input signal or an IF input signal, for example, The differential current or voltage signal is coupled into the mixer 204.

The four phase half duty cycle mixer 204 has a double ended or differential input port 201 to receive the differential current or voltage input signal on RF-IN and RF-INb. The mixer 204 has a dual differential in-phase/quadrature-phase output port 210 including a first differential in-phase output port (BB-I,BB-Ib) 210A and a second differential quadrature-phase output port (BB-Q,BB-Qb) 210B. The mixer 204 further receives four phased half duty cycle clock signals LO-I, LO-Ib, LO-Q, and LO-Qb from the clock generator or local oscillators 208.

The mixer 204 includes switches 211A-218A and switches 211B-218B coupled together as shown. Switches 211A-218A are respectively coupled in series to switches 211B-218B between the differential input port 201 and the dual differential output port 210 of the mixer 204 as shown. For example, switch 211A is coupled in series to switch 211B between the input RF-IN and the output BB-I to form a serially coupled switches 211A-211B. Additionally, pairs of serially coupled switches are further coupled in parallel between the differential input port 201 and the dual differential output port 210 of the mixer 204 as shown. For example, serially coupled switches 211A-211B are coupled in parallel to serially coupled switches 217A-217B between the differential input port (RF-IN, RF-INb) 201 and the dual differential output port (BB-I) 210 of the mixer 204 as shown.

Due to the coupling of the switches, the mixer 204 may also be referred to as a series-parallel switching mixer or a series-parallel doubled balanced mixer. The mixer 204 may be considered a passive mixer as typically power is not directly supplied to the switches.

The switches 211A-218A and switches 211B-218B have a respective control input coupled to one of the four phased half duty cycle clock or local oscillating signals LO-I, LO-Ib, LO-Q, and LO-Qb as shown in FIG. 2A. The local oscillator signal LO-I is coupled to the control input of switches 211A, 212A, 215A, and 216A. The local oscillator signal LO-Ib is coupled to the control input of switches 213A, 214A, 217A, and 218A. The local oscillator signal LO-Q is coupled to the control input of switches 212B, 213B, 216B, and 217B. The local oscillator signal LO-Qb is coupled to the control input of switches 211B, 214B, 215B, and 218B.

The switching activity of the switches 211A-218A and switches 211B-218B in response to the four phased half duty cycle clock or local oscillating signals LO-I, LO-Ib, LO-Q, and LO-Qb is described with reference to FIGS. 3A-3D and 4A-4D. The switching activity of the switches in the mixer 204 in response to the four phased half duty cycle clocks, convolves/multiplies the differential input signal with the four phased half duty cycle clocks in the time/frequency domain to concurrently generate a differential in-phase (I) signal on the in-phase differential output 210A and a differential quadrature-phase (Q) signal on the quadrature-phase differential output 210B. With the differential in-phase (I) signal and the differential quadrature-phase (Q) signal being concurrently generated by the same mixer 504, less circuit area may used and improvements in the performance of the mixer can be obtained.

The dual differential electrical (e.g., current or voltage respectively) load 206 is coupled to the dual differential in-phase/quadrature-phase output port 210 of the mixer 204. If the differential signal source 202 is providing a differential current signal source, the dual differential electrical load 206 is a current type loading so that current flows as a signal through the mixer from the differential input port to the dual differential output port. If the differential signal source 202 is providing a differential voltage signal source, the load 206 is a voltage type loading so a voltage presented as a signal at the differential input port is coupled through the mixer to the differential output port.

The dual differential output load 206 not only provides the proper loads it may also convert the differential input signals into single ended output signals. That is the differential in-phase output signal (BB-I, BB-Ib) may be converted into the in-phase output signal I and the differential quadrature-phase output signal (BB-Q, BB-Qb) may be converted into the quadrature-phase output signal Q.

As a current or voltage may be used with the mixer 204, the differential current or voltage source 202 may be referred to as an electrical differential signal source 202 and the dual differential current or voltage load 206 may be referred to as a dual differential electrical load 206.

Figure 5A:
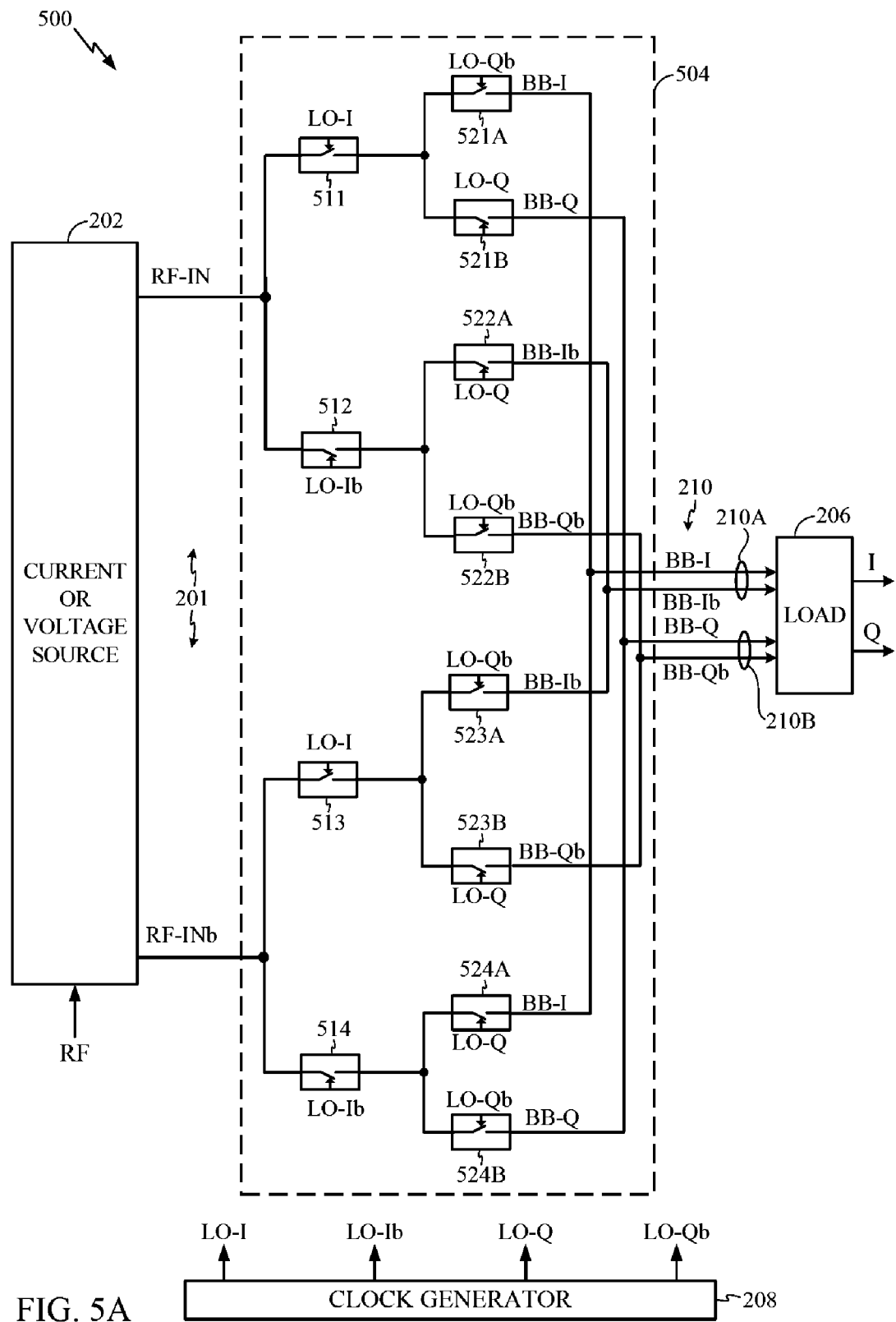
FIG. 5A is a functional block diagram of a second embodiment of a four phase half (50%) duty cycle quadrature mixer system.

Referring now to FIG. 5A, a functional block diagram of a second embodiment of a four phase half (50%) duty cycle quadrature mixer system 500 is illustrated. The system 500 includes an electrical (e.g., current or voltage) differential signal source 202, a second embodiment of a four phase half (50%) duty cycle quadrature mixer 504, a dual differential electrical (e.g., current or voltage respectively) load 206, and a four phase clock generator or local oscillator 208 coupled together as shown. The four phase half duty cycle quadrature mixer 504 may also be referred to as a cascaded double balanced switching mixer.

The electrical differential signal source 202, the dual differential electrical load 206, and the four phase clock generator 208 are described elsewhere herein with the same reference numbers, the description of which is incorporated here by reference for reasons of brevity. The architecture of the second embodiment of the four phase half (50%) duty cycle mixer 504 differs from the architecture of the first embodiment of the four phase half (50%) duty cycle mixer 204.

The four phase half duty cycle mixer 504 has a double ended or differential input port 201 to receive the differential current or voltage input signal on RF-IN and RF-INb. The mixer 504 has a dual differential output port 210 including a first in-phase (I) differential output port (BB-I,BB-Ib) 210A and a second quadrature-phase (Q) differential output port (BB-Q,BB-Qb) 210B. The mixer 504 further receives the four phased half duty cycle clock signals LO-I, LO-Ib, LO-Q, and LO-Qb from the clock generator 208.

The mixer 504 includes first level switches 511-514 and second level switches 521A-524A and 521B-524B coupled together as shown. Switches 511-514, coupled in parallel to the differential input port 201, are at a first level of switches in the mixer and coupled in series to respective pairs of parallel switches 521A-521B, 522A-522B, 523A-523B, 524A-524B, coupled in parallel to the dual differential in-phase/quadrature-phase output port, at a second level of switches in the mixer. In the mixer, the first level of switches cascade into respective second level of switches between the differential input port 201 and the dual differential I and Q output port 210. For example, the output of switch 511 couples in series to the input of the pair of parallel switches 521A-521B. The output of switch 512 couples in series to the input of the pair of parallel switches 522A-522B. The output of switch 513 couples in series to the input of the pair of parallel switches 523A-523B. The output of switch 514 couples in series to the input of the pair of parallel switches 524A-524B.

More particularly, switches 511,521A are coupled in series between the differential input port (RFIN) 201 and the in-phase differential output port (BB-I) 210A. Switches 511, 521B are coupled in series between the differential input port (RFIN) 201 and the quadrature-phase differential output port (BB-Q) 210B.

Switches 512,522A are coupled in series between the differential input port (RFIN) 201 and the in-phase differential output port (BB-Ib) 210A. Switches 512,522B are coupled in series between the differential input port (RFIN) 201 and the quadrature-phase differential output port (BB-Qb) 210B.

Switches 513,523A are coupled in series between the differential input port (RFINb) 201 and the in-phase differential output port (BB-Ib) 210A. Switches 513,523B are coupled in series between the differential input port (RFINb) 201 and the quadrature-phase differential output port (BB-Qb) 210B.

Switches 514,524A are coupled in series between the differential input port (RFINb) 201 and the in-phase differential output port (BB-I) 210A. Switches 514,524B are coupled in series between the differential input port (RFINb) 201 and the quadrature-phase differential output port (BB-Q) 210B.

Due to the coupling of the switches, the mixer 504 may also be referred to as a cascade switching mixer or a cascade doubled balanced switching mixer. The mixer 504 may be considered a passive mixer as typically power is not directly supplied to the switches.

The switches 511-514, 521A-524A, 521B-524B have a respective control input coupled to one of the four phased half duty cycle clock or local oscillating signals LO-I, LO-Ib, LO-Q, and LO-Qb as shown in FIG. 5A. The first level of switches 511-514 generally have either the LO-I or LO-Ib local oscillating signals coupled to their control inputs. The local oscillator signal LO-I is coupled to the control input of switches 511 and 513. The local oscillator signal LO-Ib is coupled to the control input of switches 512 and 514. The second level of switches 521A-524A and 521B-524B have either the LO-Q or LO-Qb local oscillating signals coupled to their control inputs. The local oscillator signal LO-Q is coupled to the control input of switches 521B, 522A, 523B, and 524A. The local oscillator signal LO-Qb is coupled to the control input of switches 521A, 522B, 523A, and 524B.

The switching activity of the first level switches 511-514 and the second level switches 521A-524A,521B-524B in response to the four phased half duty cycle clock or local oscillating signals LO-I, LO-Ib, LO-Q, and LO-Qb is described with reference to FIGS. 6A-6D and 7A-7D. The switching activity of the switches in the mixer 504 in response to the four phased half duty cycle clocks, convolves/multiplies the differential input signal with the four phased half duty cycle clocks in the time/frequency domain to concurrently generate a differential in-phase (I) signal on the in-phase differential output 210A of the dual differential in-phase/quadrature-phase output port 210 and a differential quadrature-phase (Q) signal on the quadrature-phase differential output 210B of the dual differential in-phase/quadrature-phase output port 210. With the differential in-phase (I) signal and the differential quadrature-phase (Q) signal being concurrently generated by the same mixer 504, less circuit area may used and improvements in the performance of the mixer can be obtained.

The current or voltage load 206 is coupled to the dual differential in-phase/quadrature-phase output port 210 of the mixer 504.

Four Phased Half Duty Cycle Clock Signals

The clock generator 208 generates the four phased half duty cycle clock or local oscillating signals LO-I, LO-Ib, LO-Q, and LO-Qb such as shown in FIGS. 4A-4D and 7A-7D. The four phased half duty cycle clock or local oscillating signals LO-I, LO-Ib, LO-Q, and LO-Qb are each out of phase from each other by a multiple of ninety degrees. For example, the local oscillating signal LO-I is out of phase from the local oscillating signal LO-Q by a multiple of one or ninety degrees. The local oscillating signal LO-I is out of phase from the local oscillating signal LO-Ib by a multiple of two or one-hundred eighty degrees. The local oscillating signal LO-I is out of phase from the local oscillating signal LO-Qb by a multiple of three or two-hundred seventy degrees. The four phased half duty cycle clock or local oscillating signals LO-I, LO-Ib, LO-Q, and LO-Qb are each a square waveform with a fifty percent (50%) duty cycle.

Figure 4A:
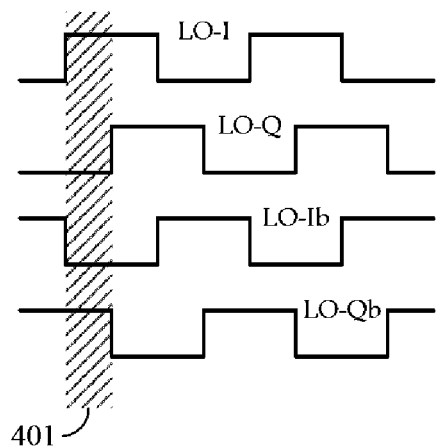
FIGS. 4A-4D are waveform diagrams of the four phased half duty cycle clock or local oscillating signals illustrating each of four phases.
Figure 7A:
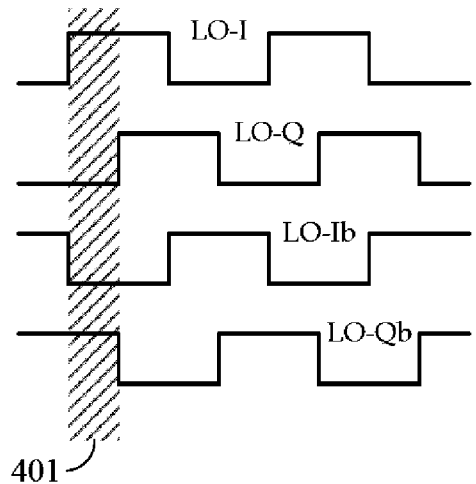
FIGS. 7A-7D are waveform diagrams of the four phased half duty cycle clock or local oscillating signals illustrating each of four phases.

Referring now to FIGS. 4A,7A, a first phase 401 is generated by the clock generator 208. In the first phase 401, the local oscillating signals LO-I and LO-Qb are logically high (e.g., a logical one) and the local oscillating signals LO-Q and LO-Ib are logically low (e.g., a logical zero).

Figure 4B:
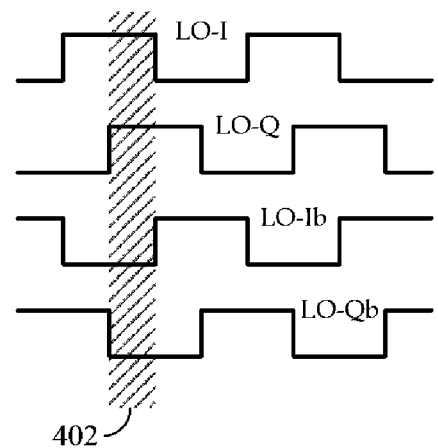
Figure 7B:
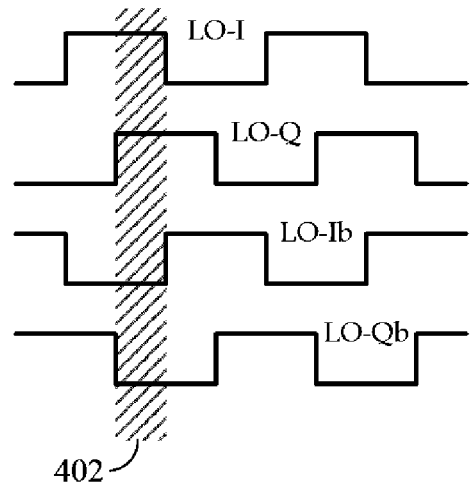

Referring now to FIGS. 4B,7B, a second phase 402 is generated by the clock generator 208. In the second phase 402, the local oscillating signals LO-I and LO-Q are logically high (e.g., a logical one) and the local oscillating signals LO-Qb and LO-Ib are logically low (e.g., a logical zero).

Figure 4C:
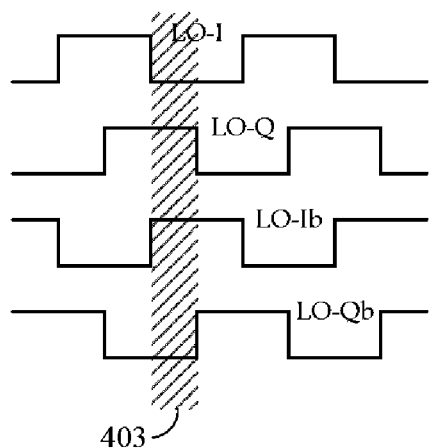
Figure 7C:
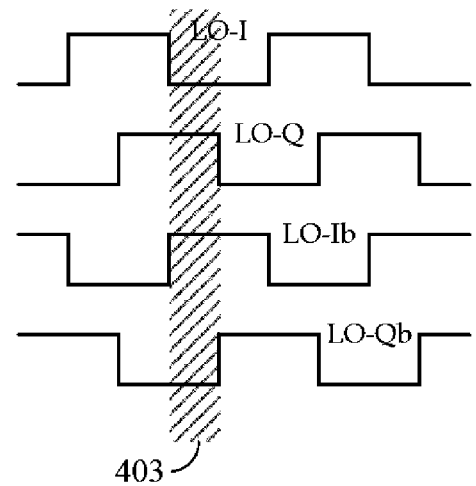

Referring now to FIGS. 4C,7C, a third phase 403 is generated by the clock generator 208. In the third phase 403, the local oscillating signals LO-Ib and LO-Q are logically high (e.g., a logical one) and the local oscillating signals LO-Qb and LO-I are logically low (e.g., a logical zero).

Figure 4D:
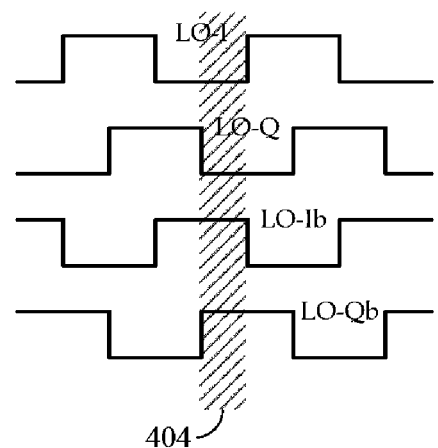
Figure 7D:
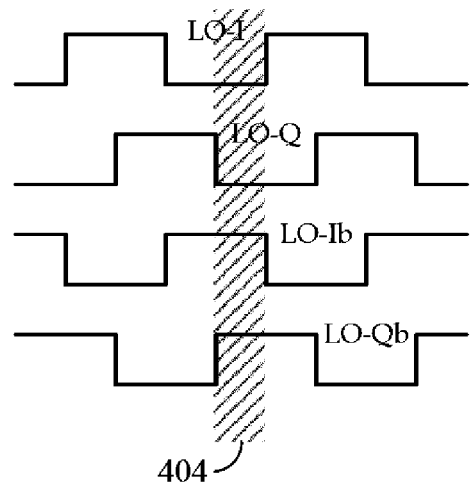

Referring now to FIGS. 4D,7D, a fourth phase 404 is generated by the clock generator 208. In the fourth phase 404, the local oscillating signals LO-Ib and LO-Qb are logically high (e.g., a logical one) and the local oscillating signals LO-Q and LO-I are logically low (e.g., a logical zero).

Four Phase Half Duty Cycle Mixer Operation

The operation of the first embodiment of the four phase half duty cycle mixer 204 is now described with reference to FIGS. 3A-3D and 4A-4D.

Generally, the four phased half duty cycle clocks (LO-I, LO-Ib, LO-Q, LO-Qb) are generated with each being out of phase by a multiple of ninety degrees from the others. The four phased half duty cycle clocks are coupled into a four phase half duty cycle mixer 204,205. The switches in the four phase half duty cycle mixer are switched in response to the four phased half duty cycle clocks to convolve a differential input signal 201 with the four phased half duty cycle clocks to concurrently generate a differential in-phase output signal I and a differential quadrature-phase output signal Q on the dual differential output port (BB-I,BB-Ib)(BB-Q,BB-Qb) 210.

Figure 3A:
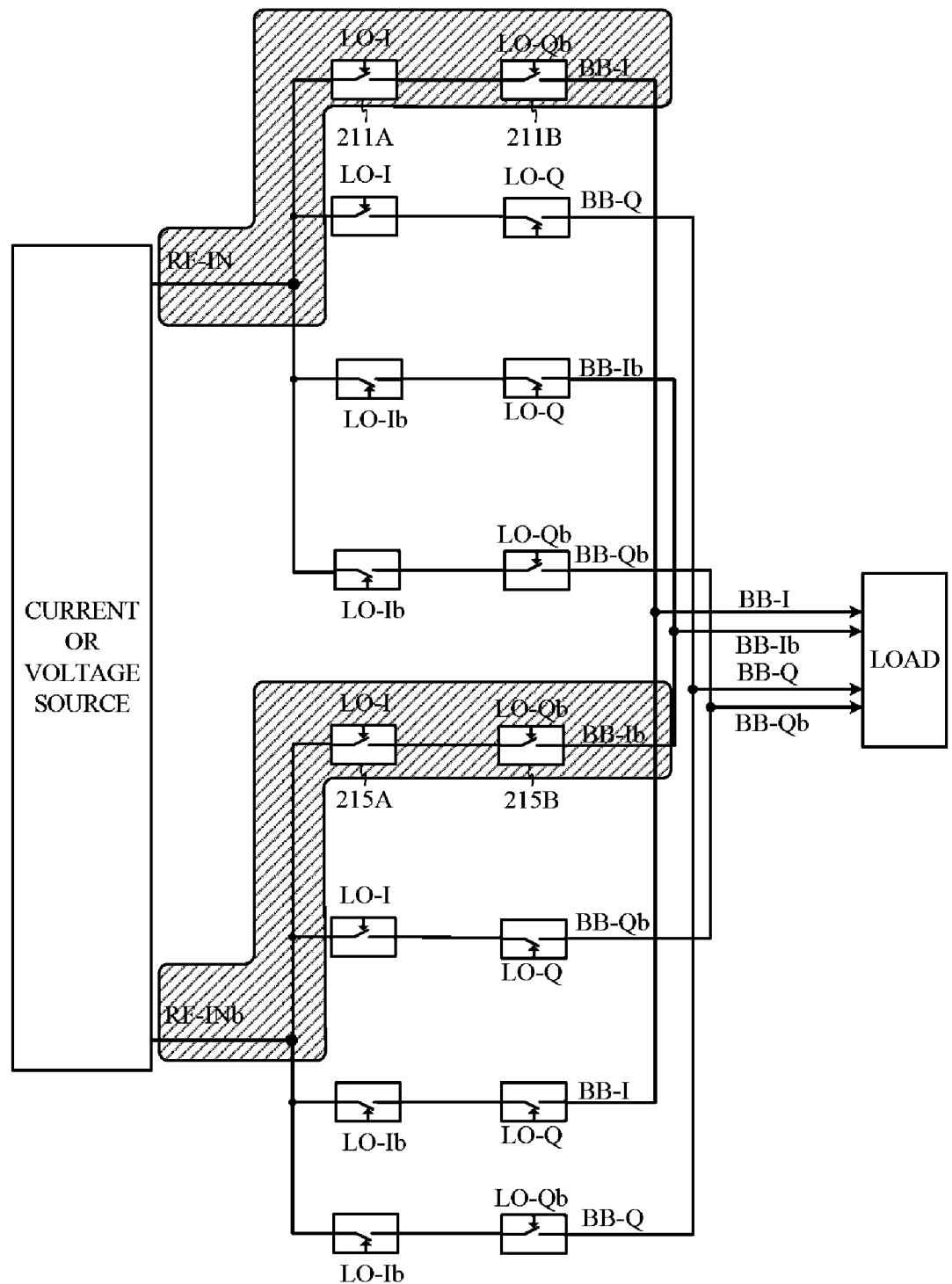
FIGS. 3A-3D illustrate the switching activity of the switches in the mixer shown in FIG. 2A,2B in response to the four phased half duty cycle clocks.

Referring to FIGS. 2A, 3A, and 4A, in the first phase 401 with the local oscillating signals LO-I and LO-Qb logically high (e.g., a logical one), switches 211A-211B are both respectively closed such that RF-IN passes through the mixer 204 to the BB-I output coupled into the load 206. Switches 215A-215B are also closed such that RF-INb passes through the mixer 204 to the BB-Ib output coupled into the load 206.

Figure 3B:
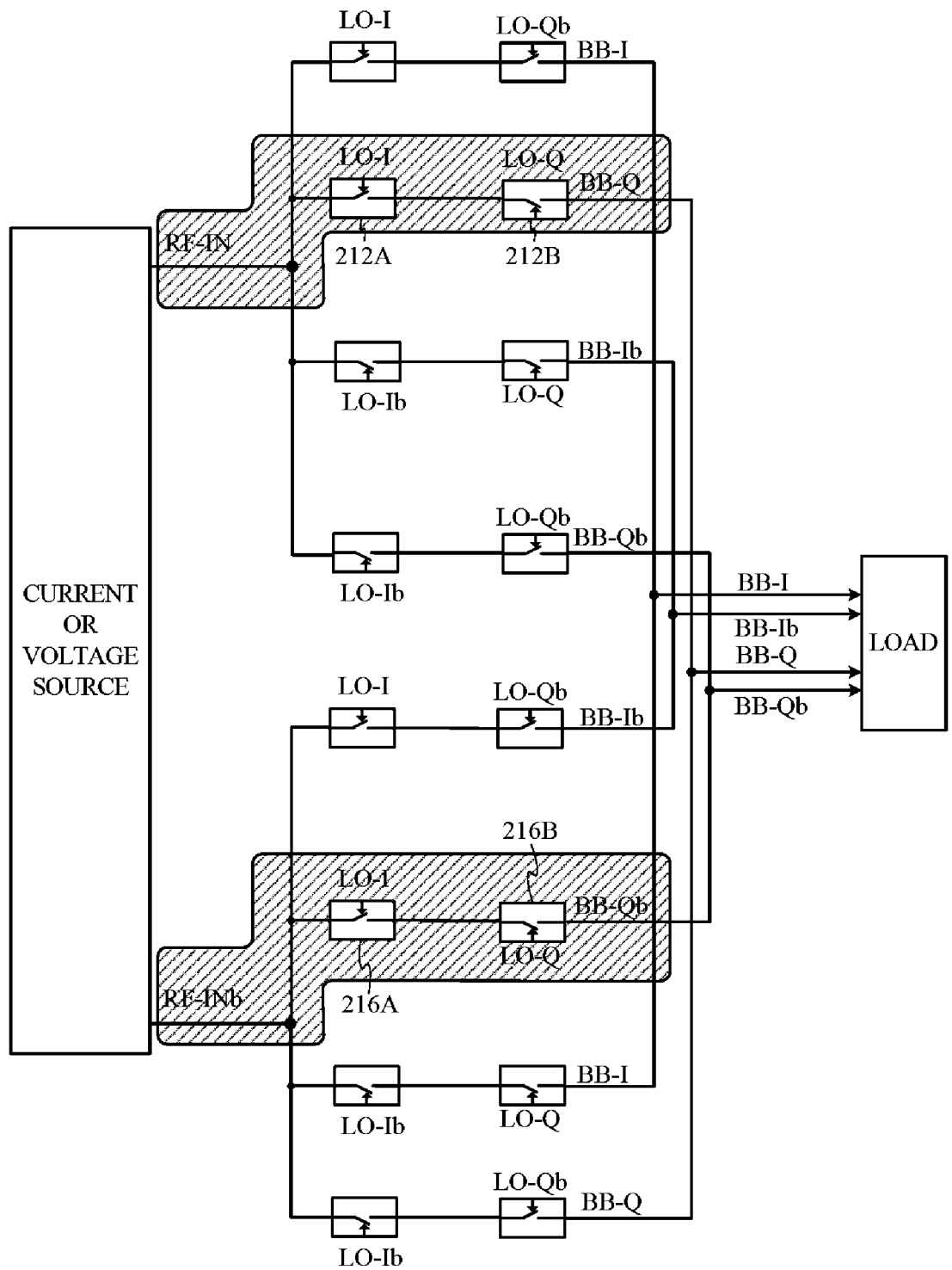

Referring to FIGS. 2A, 3B, and 4B, in the second phase 402 with the local oscillating signals LO-I and LO-Q logically high (e.g., a logical one), switches 212A-212B are both closed such that RF-IN passes through the mixer 204 to the BB-Q output coupled into the load 206. Switches 216A-216B are both also closed such that RF-INb passes through the mixer 204 to the BB-Qb output coupled into the load 206.

Figure 3C:
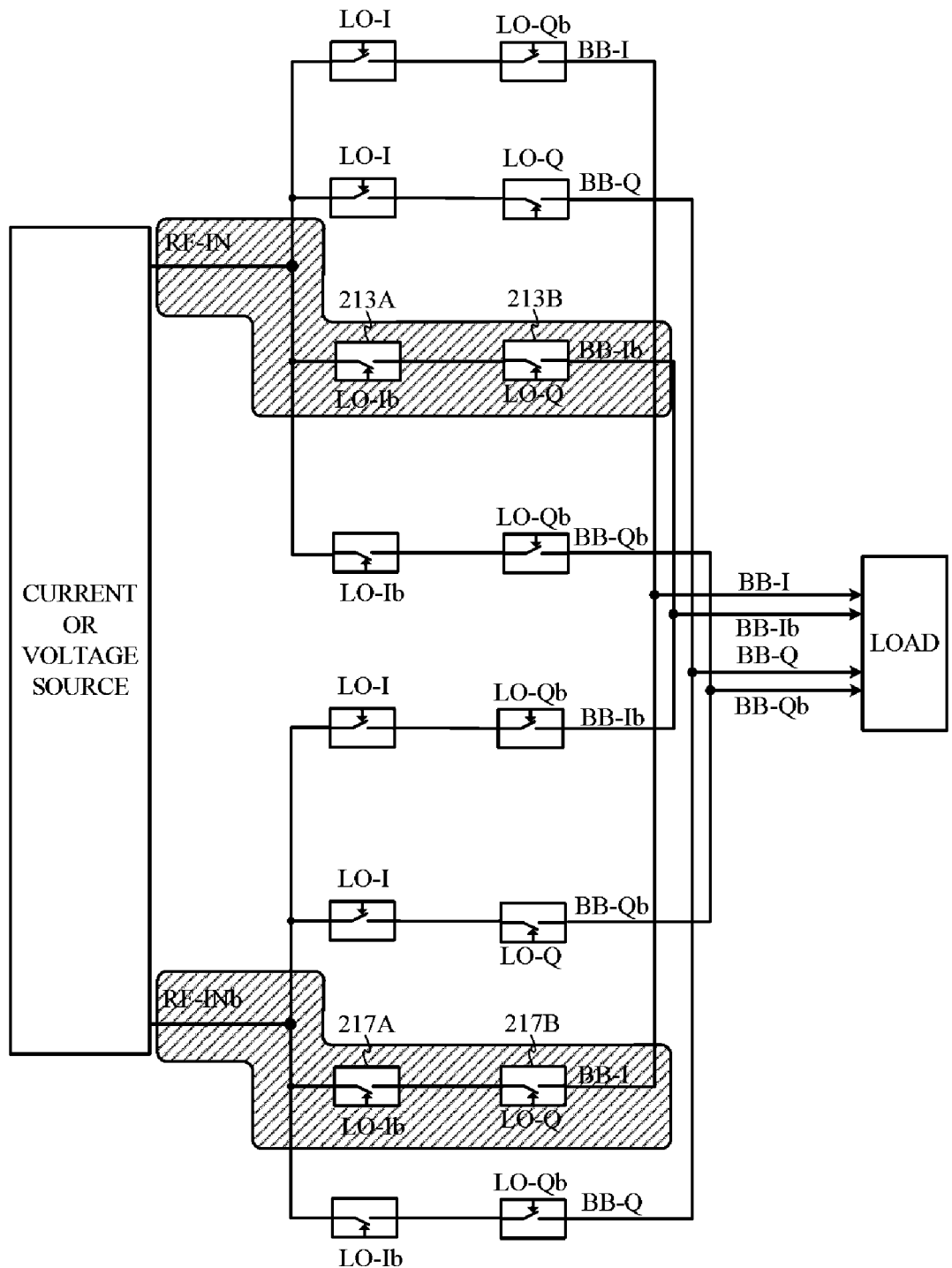

Referring to FIGS. 2A, 3C, and 4C, in the third phase 403 with the local oscillating signals LO-Ib and LO-Q logically high (e.g., a logical one), switches 213A-213B are both closed such that RF-IN passes through the mixer 204 to the BB-Ib output coupled into the load 206. Switches 217A-217B are both also closed such that RF-INb passes through the mixer 204 to the BB-I output coupled into the load 206.

Figure 3D:
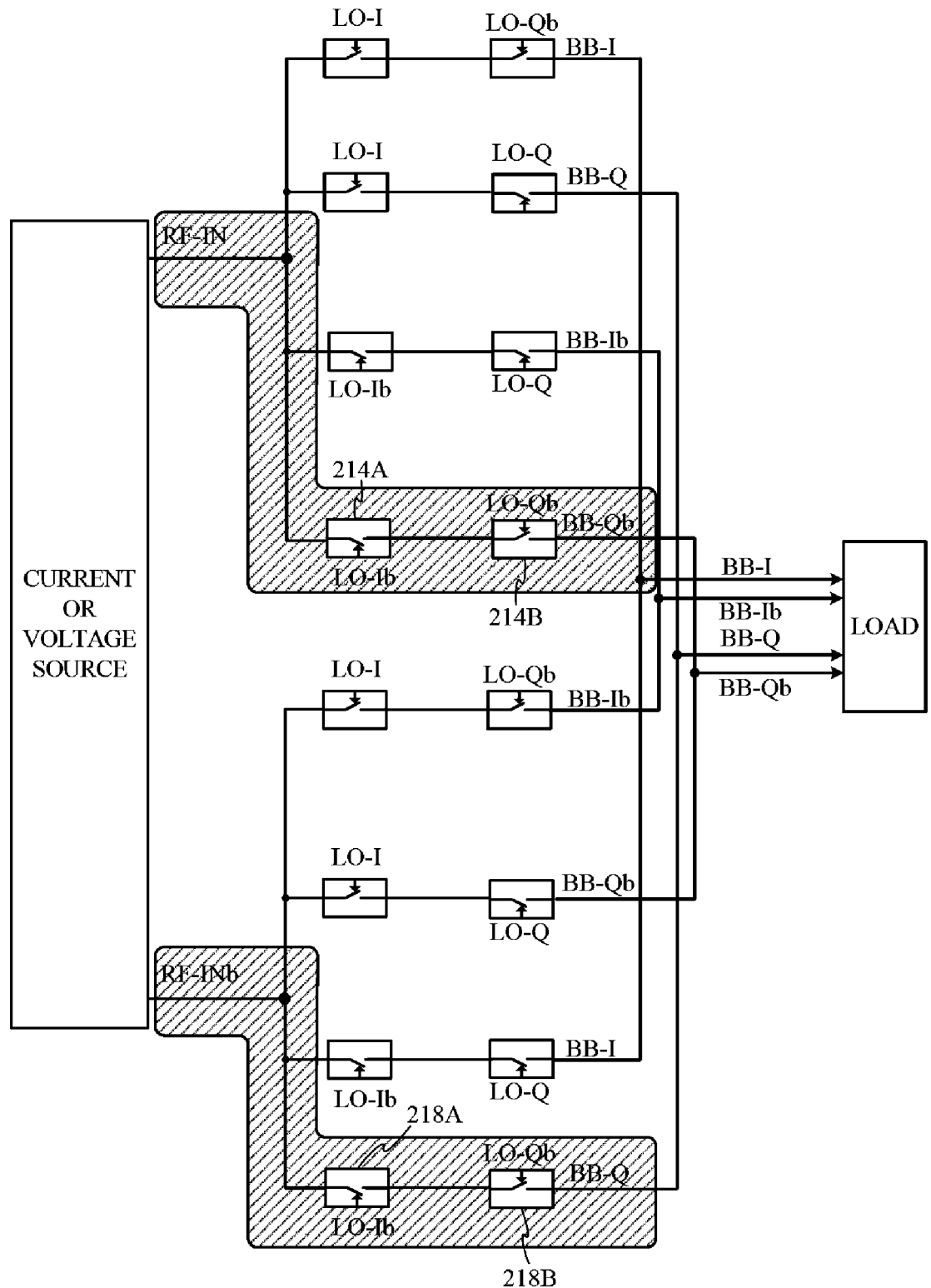

Referring to FIGS. 2A, 3D, and 4D, in the fourth phase 404 with the local oscillating signals LO-Ib and LO-Q logically high (e.g., a logical one), switches 214A-214B are both closed such that RF-IN passes through the mixer 204 to the BB-Qb output coupled into the load 206. Switches 218A-218B are both also closed such that RF-INb passes through the mixer 204 to the BB-Q output coupled into the load 206.

The four phases of the local oscillating signals are generated over and over again to repeat the switching sequence of the transistors in the mixer 204 and the respective paths through the mixer.

The operation of the second embodiment of the four phase half duty cycle mixer 504 is now described with reference to FIGS. 6A-6D and 7A-7D.

Figure 6A:
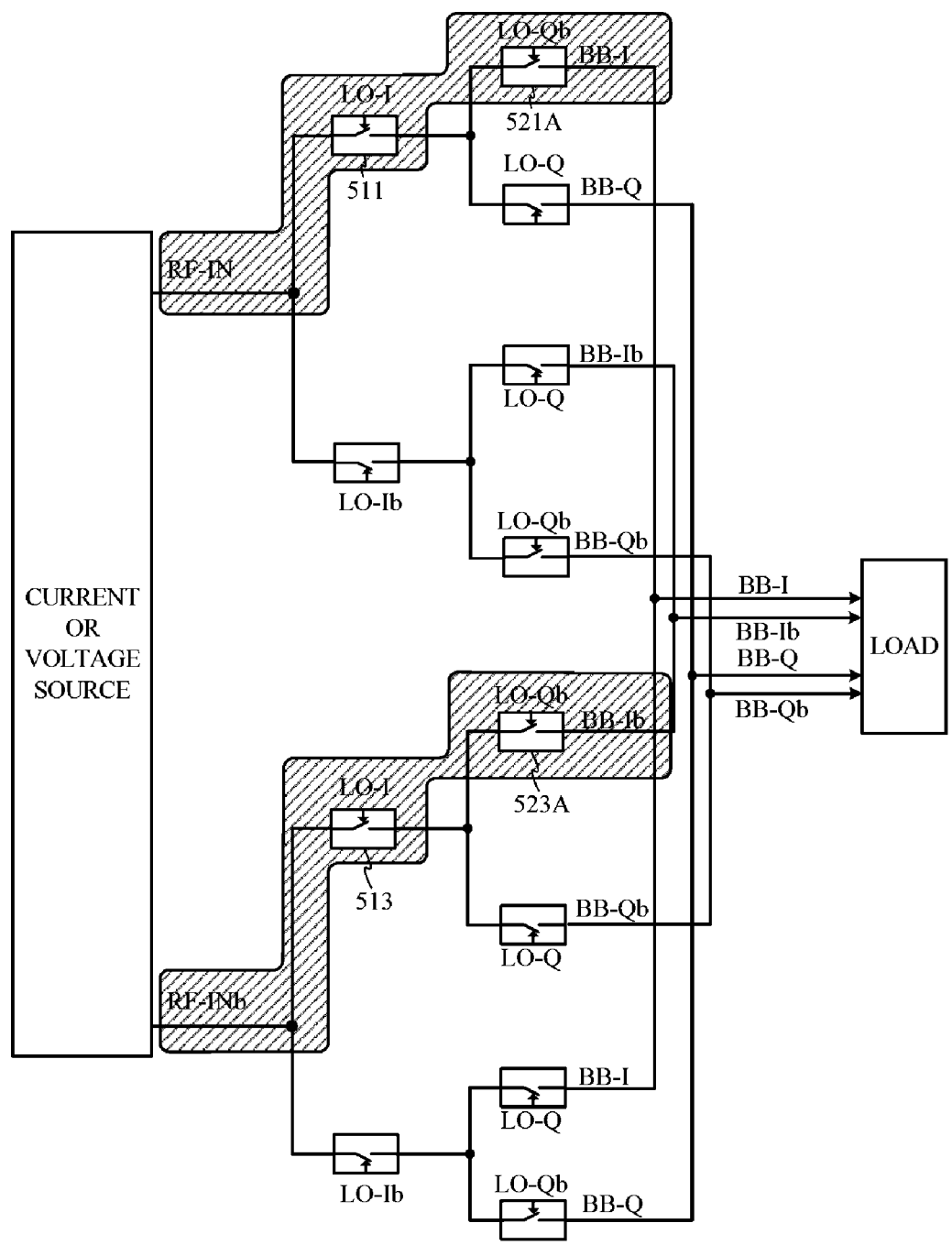
FIGS. 6A-6D illustrate the switching activity of the switches in the mixer shown in FIG. 5A,5B in response to the four phased half duty cycle clocks.

Referring to FIGS. 5A, 6A, and 7A, in the first phase 401 with the local oscillating signals LO-I and LO-Qb logically high (e.g., a logical one), switches 511,521A are both respectively closed such that the positive RF input terminal RF-IN passes through the mixer 504 to the positive in-phase output terminal BB-I which is coupled into the load 206. Switches 513,523A are also closed such that negative RF input terminal RF-INb passes through the mixer 504 to the negative in-phase output terminal BB-Ib coupled into the load 206.

Figure 6B:
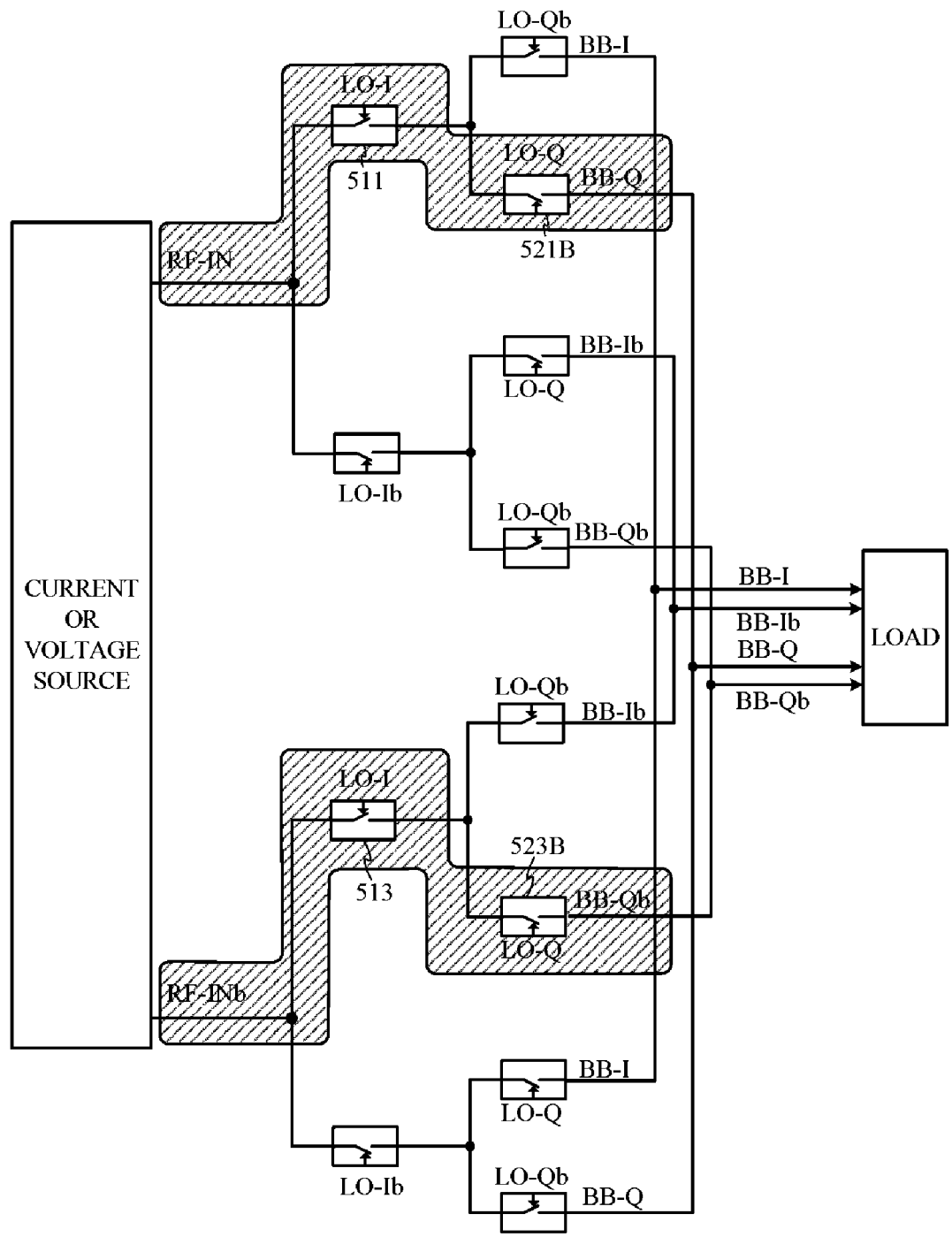

Referring to FIGS. 5A, 6B, and 7B, in the second phase 402 with the local oscillating signals LO-I and LO-Q logically high (e.g., a logical one), switches 511,521B are both closed such that the positive RF input terminal RF-IN passes through the mixer 504 to the positive quadrature-phase output terminal BB-Q coupled into the load 206. Switches 513,523B are both also closed such that the negative RF input terminal RF-INb passes through the mixer 504 to the negative quadrature-phase output terminal BB-Qb coupled into the load 206.

Figure 6C:
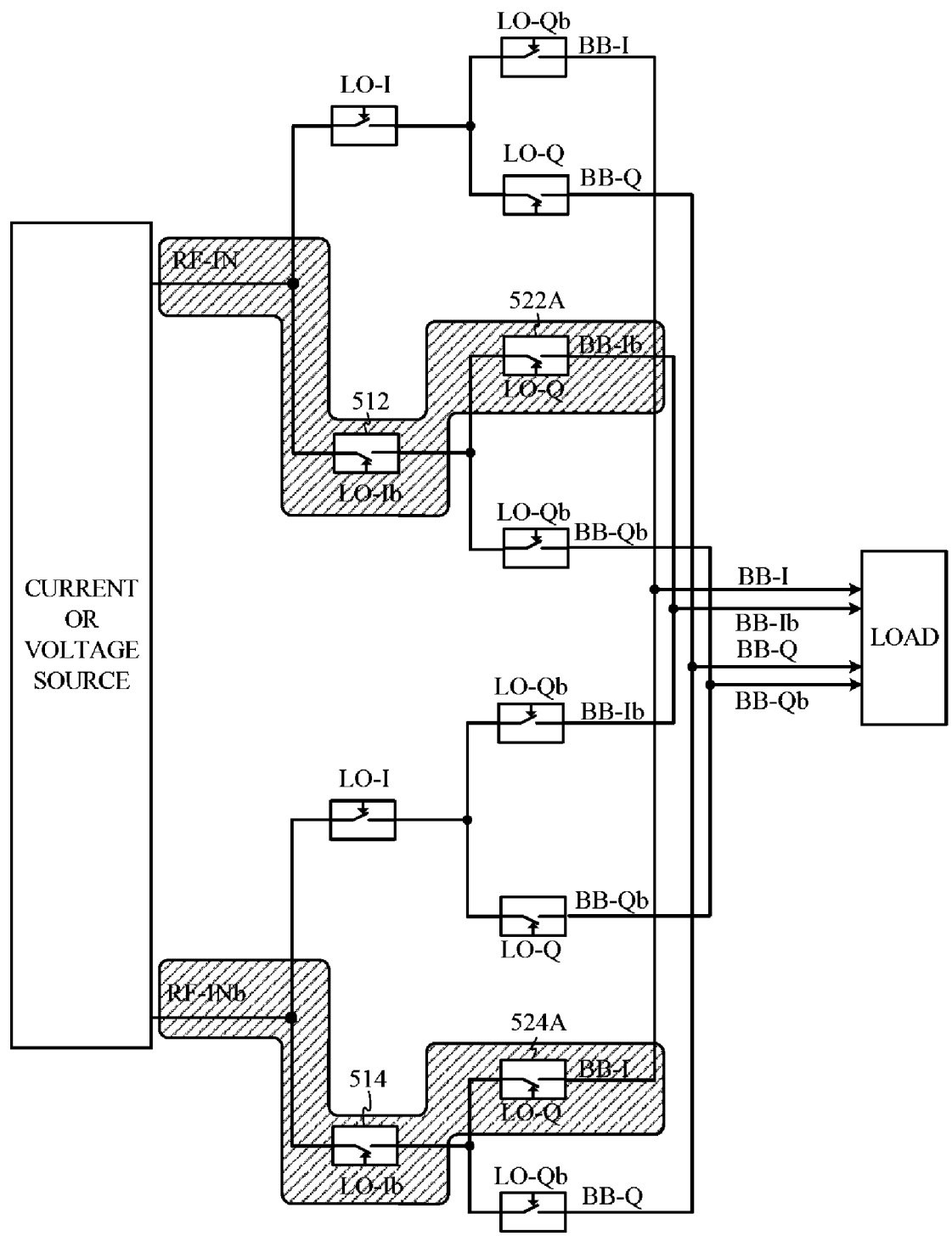

Referring to FIGS. 5A, 6C, and 7C, in the third phase 403 with the local oscillating signals LO-Ib and LO-Q logically high (e.g., a logical one), switches 512,522A are both closed such that positive RF input terminal RF-IN passes through the mixer 504 to the negative in-phase output terminal BB-Ib coupled into the load 206. Switches 514,524A are both also closed such that the negative RF input terminal RF-INb passes through the mixer 504 to the positive in-phase output terminal BB-I coupled into the load 206.

Figure 6D:
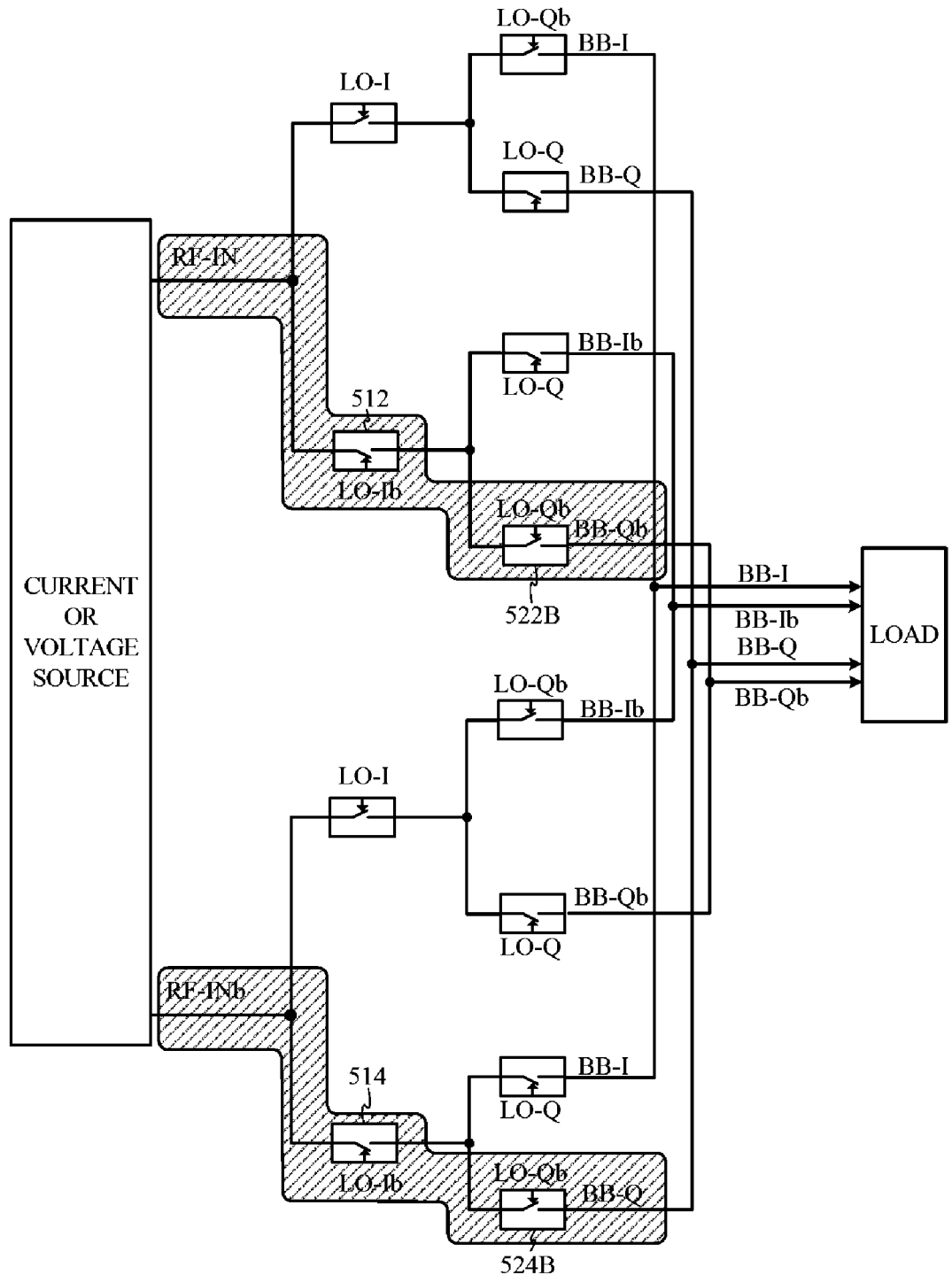

Referring to FIGS. 5A, 6D, and 7D, in the fourth phase 404 with the local oscillating signals LO-Ib and LO-Q logically high (e.g., a logical one), switches 512,522B are both closed such that positive RF input terminal RF-IN passes through the mixer 504 to the negative quadrature-phase output terminal BB-Qb coupled into the load 206. Switches 514,524B are both also closed such that the negative RF input terminal RF-INb passes through the mixer 504 to the positive quadrature-phase output terminal BB-Q coupled into the load 206.

Switches

Figure 9:
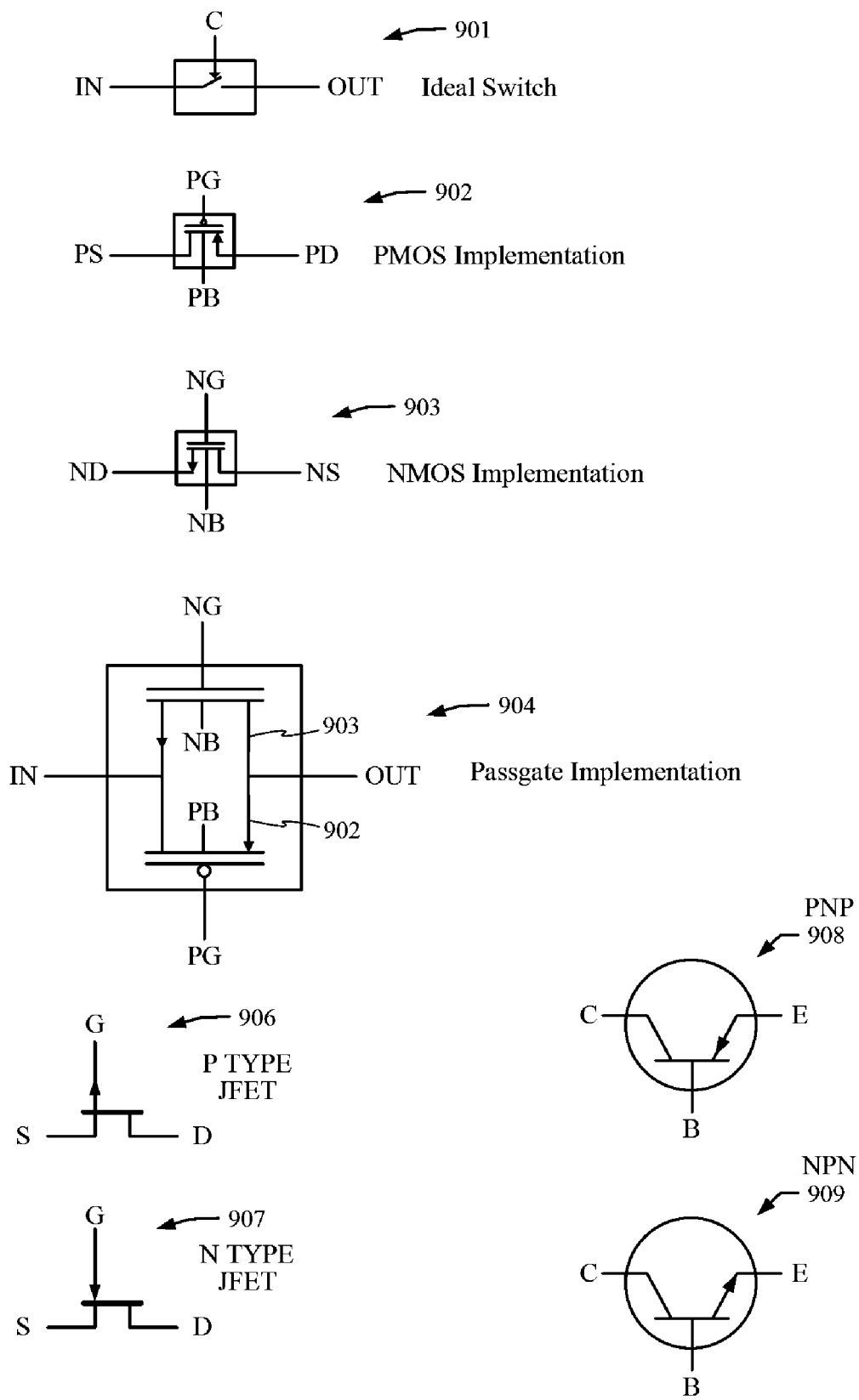
FIG. 9 illustrates different types of switches that may be applied in implementing the quadrature mixers illustrated in FIGS. 2A and 5A.

Referring now to FIG. 9, a plurality of switches are illustrated which may be applied in implementing the mixers 205, 504. Each of the switches 211A-218B in the mixer 204 illustrated in FIG. 2A and each of the switches 511-514, 521A-524A, 521B-524B illustrated in FIG. 5A are ideal switches. An ideal switch 901 is illustrated in FIG. 9. The ideal switch 901 has a control input terminal C, an input terminal IN, and an output terminal OUT. In the mixers 204, 504, the control input C is coupled to one of the four phased half duty cycle local oscillator or four phased half duty cycle clock signals. The ideal switch is closed coupling the input terminal IN to the output terminal OUT by a positive polarity of a respective one of the four phased half duty cycle clock or local oscillating signals LO-I, LO-Ib, LO-Q, and LO-Qb such as shown in FIGS. 4A-4D and 7A-7D.

Instead of ideal switches 901 being used as the switches in the mixer 204 and the mixer 504, different types of transistor switches may be used as the switches in the mixers.

For example, a first group or type of transistor switches may be used that are closed by the application of a high voltage level upon their control terminal and opened by the application of a low voltage level upon their control terminal. The first type of transistor switch includes an n-channel field effect transistor (NFET) 903, an n-type junction field effect transistor (JFET) 907, and an NPN bipolar junction transistor (BJT) 909 that may be used as the switches in the implementation of the mixers 204,504. Thus, the first type of transistor switch is closed by a positive polarity of a respective one of the four phased half duty cycle clock or local oscillating signals LO-I, LO-Ib, LO-Q, and LO-Qb such as shown in FIGS. 4A-4D and 7A-7D to a allow current to flow across its poles (e.g., source and drain or collector and emitter) at the appropriate time.

Alternatively, a second group or type of transistor switches may be used that close with the application of a low voltage level upon their control terminals and open with the application of a high voltage level upon their control terminals. The second group or type of transistor switch includes a p=channel field effect transistor (PFET) 902, a p-type junction field effect transistor (JFET) 906, and a PNP bipolar junction transistor (BJT) 908 that may be used as the switches in the implementation of the mixers 204,504. Thus, the second group or type of transistor switch is closed by a negative polarity of a respective one of the four phased half duty cycle clock or local oscillating signals LO-I, LO-Ib, LO-Q, and LO-Qb to a allow current to flow across its poles (e.g., source and drain or collector and emitter). That is, the respective positive polarity of the four phased half duty cycle clock or local oscillating signals LO-I, LO-Ib, LO-Q, and LO-Qb is inverted and coupled to the control terminal (e.g., gate) of the second group or type of transistor switch to close it at the appropriate time.

Alternatively a combination of the first type and the second type of transistor switches may be used in parallel together as the switches in the implementation of the mixers 204,504 in the form of a fully complementary transfer or pass gate 904, such as a PFET 902 and an NFET 903 with source and drains coupled together in parallel.

The PFET 902 includes a source terminal PS and a drain terminal PD for poles of a switch, a gate terminal PG as the control terminal of the switch, and a body terminal PB. The PFET body terminal PB in an analog transfer gate connection is typically coupled to the PFET source terminal PS.

The NFET 903 includes a source terminal NS and a drain terminal ND for poles of a switch, a gate terminal NG as the control terminal of the switch, and a body terminal NB. The NFET body terminal NB in an analog transfer gate connection is typically coupled to the NFET source terminal NS.

The transfer gate 904 includes an input terminal IN (e.g., PS and NS or PD and ND) and an output terminal OUT (e.g., PD and ND or PS and NS) as poles of a switch, a pair of control terminals (e.g., NG and PG) as control terminals of the switch, and a pair of body terminals (e.g., NB and PB). The NFET body terminal NB in an analog transfer gate connection is typically coupled to the NFET source terminal NS. The PFET body terminal PB in an analog transfer gate connection is typically coupled to the PFET source terminal PS.

The p-type JFET 906 includes a source terminal S and a drain terminal D for poles and a gate terminal G for the control terminal of the switch. Similarly, the n-type JFET 907 also includes a source terminal S and a drain terminal D for poles and a gate terminal G for the control terminal of the switch.

The PNP bipolar junction transistor (BJT) 908 includes a collector terminal C and an emitter terminal for poles of a switch and a base terminal for the control terminal of the switch. Similarly, the NPN bipolar junction transistor (BJT) 909 includes a collector terminal C and an emitter terminal for poles of a switch and a base terminal for the control terminal of the switch.

While the transistor switches have been described herein as being switched or turned on by various polarities of control signals coupled to the control terminal of the transistor, the level of voltage applied to the control terminals may be set so that the transistors are turned on differently. For example, the NFETs, PFETs, n-type JFETs, and p-type JFETS may be turned on into a saturation (active) region or into a triode (linear or passive) region. Similarly, the bipolar junction transistors may be biased on into a forward-active region of operation.

The voltage levels of the respective control signals (e.g., the four phased half duty cycle clock or local oscillating signals LO-I, LO-Ib, LO-Q, and LO-Qb) coupled to the control terminals of the switches are adjusted accordingly to the type of switches and their desired form of operation.

NFET Mixer Implementation

Figure 2B:
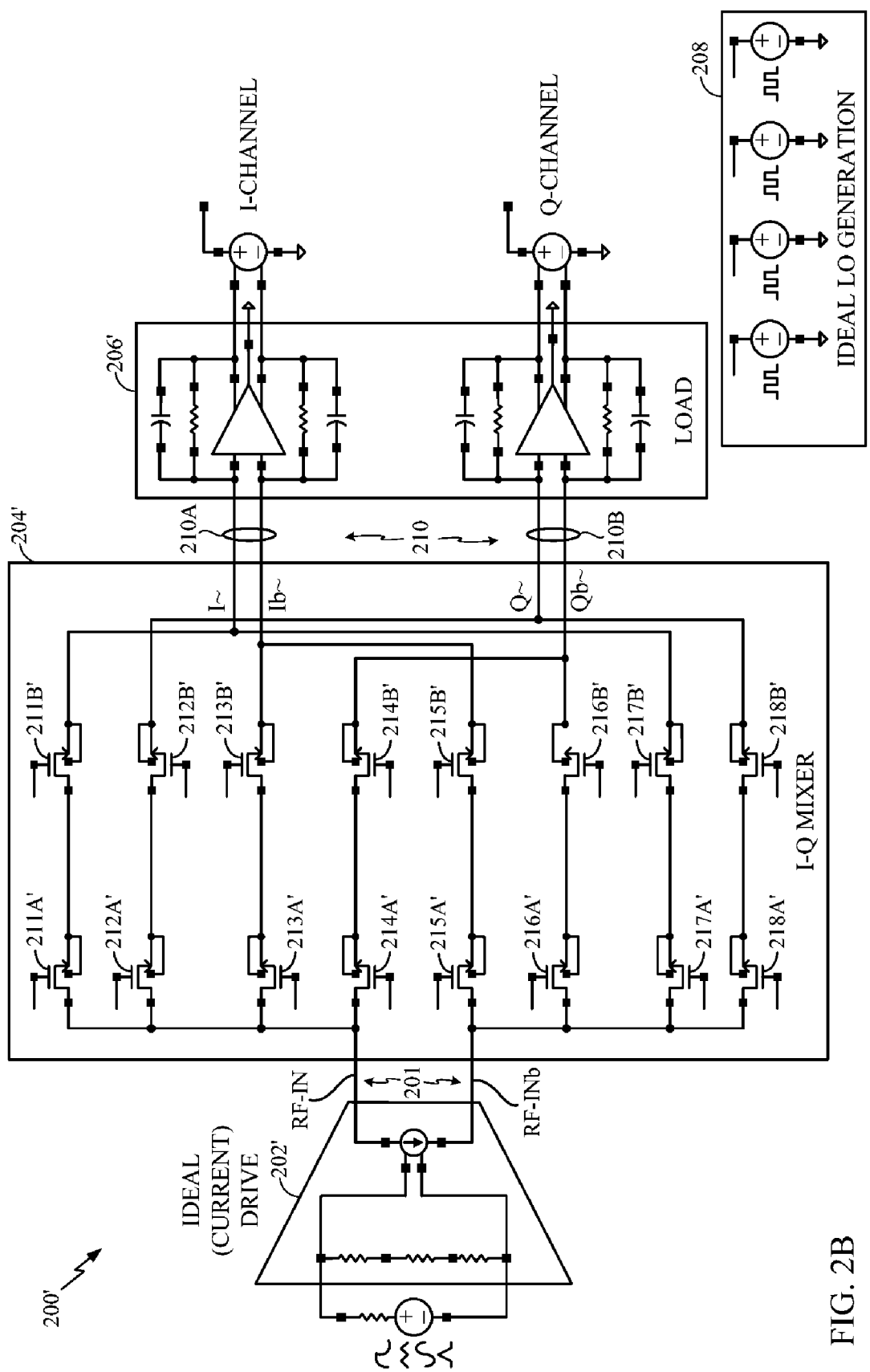
FIG. 2B is a schematic diagram illustrating an exemplary implementation of the mixer illustrated in the four phase half (50%) duty cycle quadrature mixer system of FIG. 2A.

FIG. 2B illustrates a schematic diagram of an implementation of a mixer system 200'. The mixer system 200' includes the mixer 204' implemented with NFETs 903 along with an ideal current drive 202', an ideal LO generator 208', and a dual port load 206' for simulating the mixer 204'.

The mixer 204' includes NFETs 211A'-218A' and 211B-218B' coupled together as shown in FIG. 2B. The NFETs 211A'-218A' and 211B-218B' of the mixer 204' respectively correspond to switches 211A-218A and 211B-218B of mixer 204 described previously with reference to FIG. 2A. The function of the mixer 204' is substantially similar to the function of mixer 204 and is not repeated here for reasons of brevity.

Figure 5B:
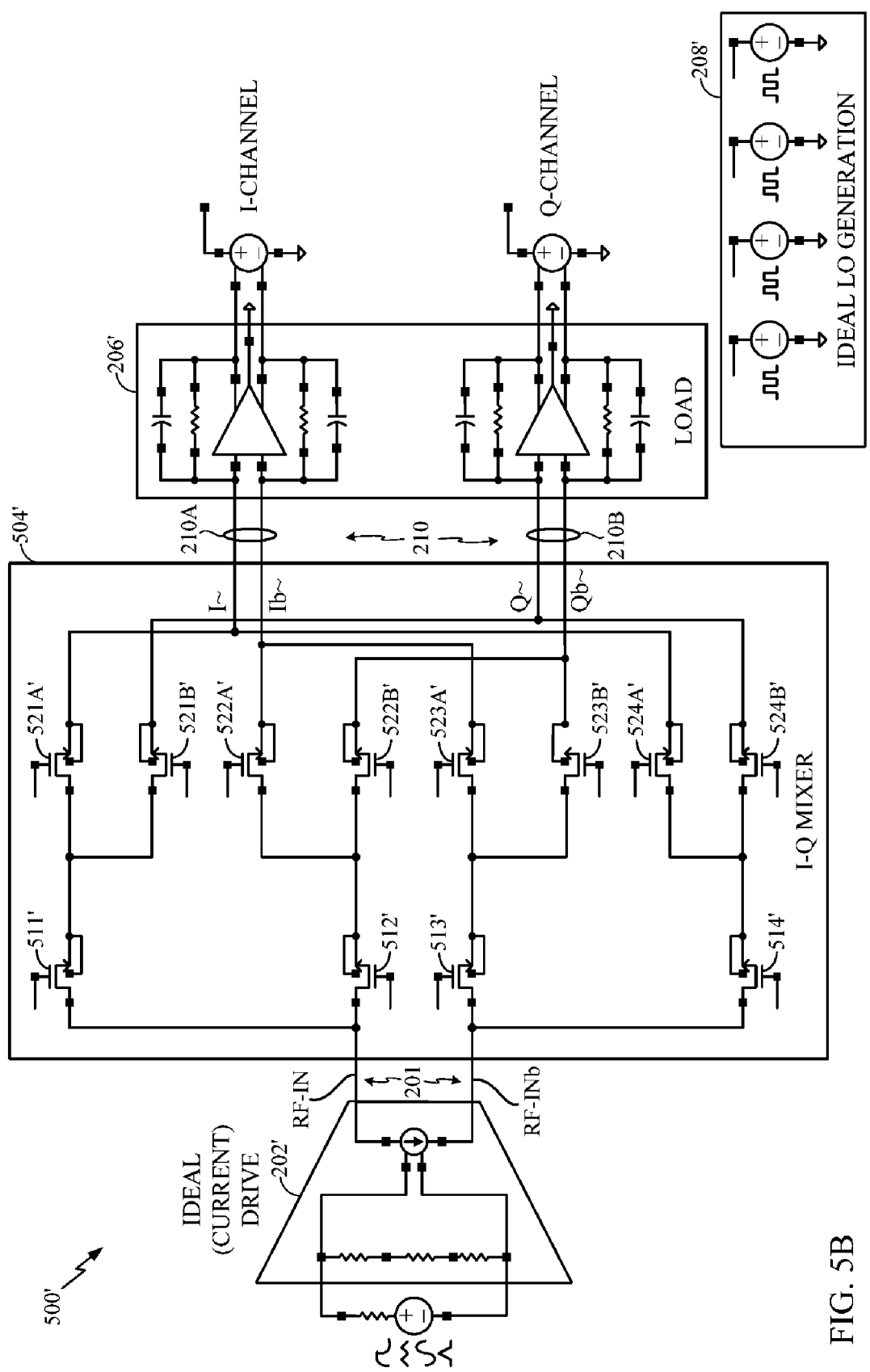
FIG. 5B is a schematic diagram illustrating an exemplary implementation of the mixer illustrated in the four phase half (50%) duty cycle quadrature mixer system of FIG. 5A.

FIG. 5B illustrates a schematic diagram of an implementation of a mixer system 500'. The mixer system 500' includes the mixer 504' implemented with NFETs 903 along with the ideal current drive 202', an ideal LO generator 208', and dual port load 206 for simulating the mixer 504'.

The mixer 504' includes NFETs 511'-514', 521A'-524A', and 521B'-524B' coupled together as shown in FIG. 5B. The NFETs 511'-514', 521A'-524A', and 521B'-524B' of mixer 504' respectively correspond to switches 511-514, 521A-524A, and 521B-524B of mixer 504 described previously with reference to FIG. 5A. The function of the mixer 504' is substantially similar to the function of mixer 504 and is not repeated here for reasons of brevity.

System Application

Figure 8:
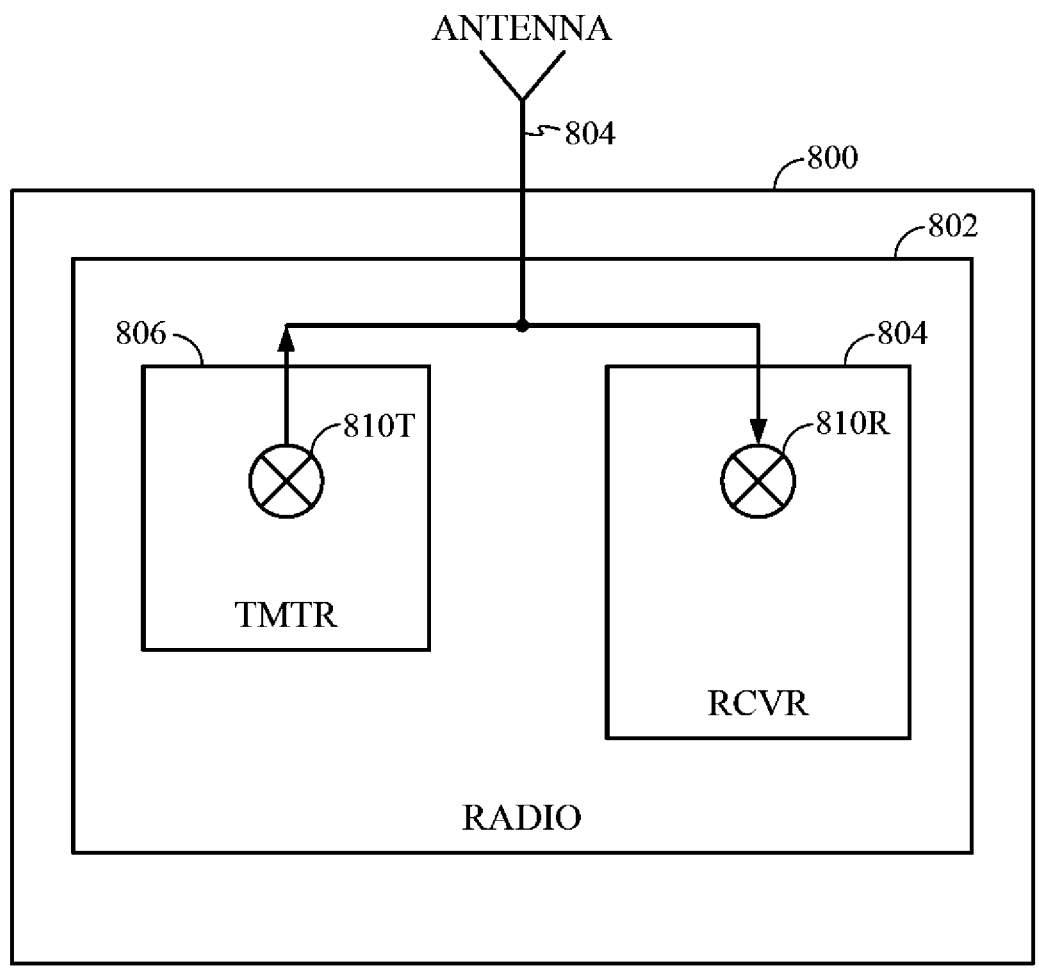
FIG. 8 illustrates a functional block diagram of a simplified radio system in which embodiments of the invention may be used

Referring now to FIG. 8, a radio system 800 is illustrated in which the embodiments of the inventive RF mixers described herein may be used. The radio system 800 may be a mobile cellular telephone for example. The radio system 800 includes a radio frequency RF circuit 802 coupled to an antenna 804. The RF circuit 802 may include one or both of an RF transmitter 806 and an RF receiver 810R coupled to the antenna 804.

One or more mixers may be used as an upconverter 810T in the RF transmitter 806. One or more mixers may be used as a downcoverter 810R in the RF receiver 804. The quadrature four phase half duty cycle RF mixers described herein may be used as one or more instances of quadrature mixers for the upconverter 810T and/or the downconverter 801R.

CONCLUSION

While certain exemplary embodiments have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art. Instead, the embodiments of the invention should be construed according to the claims that follow below.

What is claimed is:

1. A radio frequency mixer system comprising:
   a four phase clock generator to generate four phased half duty cycle clocks each being out of phase by ninety degrees from each adjacent phased half duty cycle clock;
   a dual differential electrical load having a first differential input and a second differential input and configured to convert the differential input signals into single ended outputs; and
   a four phase half duty cycle mixer having a differential input port coupled to a differential input signal, an in-phase (I) differential output port coupled to the first differential input of the dual differential load, and a quadrature-phase (Q) differential output port coupled to the second differential input of the dual differential load, the mixer further having a plurality of switches with control inputs coupled to the four phase clock generator to receive each of the four phased half duty cycle clocks, the mixer to convolve the differential input signal with the four phased half duty cycle clocks to generate a differential in-phase output signal on the in-phase differential output and a differential quadrature-phase output signal on the quadrature-phase differential output, wherein the plurality of switches includes a first plurality of pairs of serially coupled switches coupled in parallel between the differential input port and the in-phase differential output port and a second plurality of pairs of serially coupled switches coupled in parallel between the differential input port and the quadrature-phase differential output port, and wherein the plurality of switches are configured to output both differential in-phase output signals to a first set of differential inputs of the dual differential load on a first and a third phase of the phased half duty cycle clocks and to output both differential quadrature-phase output signals to a second set of differential inputs of the dual differential load on a second and a fourth phase of the phased half duty cycle clocks being out of phase by ninety degrees from each adjacent phased half duty cycle clock.

2. The radio frequency mixer system of claim 1, further comprising:
a differential signal source having a differential output coupled to the differential input port of the four phase half duty cycle mixer, the differential signal source to generate the differential input signal in response to a non-differential input signal.

3. The radio frequency mixer system of claim 1, wherein the plurality of switches includes
a plurality of first level switches coupled in parallel to the differential input port; and
a plurality of pairs of parallel second level switches coupled in series to respective first level switches and to the dual differential output port.

4. The radio frequency mixer system of claim 1, wherein the differential input signal is a radio frequency differential input signal,
the differential in-phase output signal is an intermediate frequency differential in-phase output signal, and
the differential quadrature-phase output signal is an intermediate frequency differential quadrature-phase output signal.

5. The radio frequency mixer system of claim 1, wherein the differential input signal is an intermediate frequency differential input signal,
the differential in-phase output signal is a radio frequency differential in-phase output signal, and
the differential quadrature-phase output signal is a radio frequency differential quadrature-phase output signal.

6. A method comprising:
generating four phased half duty cycle clocks each being out of phase by ninety degrees from each adjacent phased half duty cycle clock;
coupling the four phased half duty cycle clocks into a four phase half duty cycle mixer;
switching switches in the four phase half duty cycle mixer in response to the four phased half duty cycle clocks to convolve a differential input signal with the four phased half duty cycle clocks to generate a differential in-phase output signal and a differential quadrature-phase output signal on a dual differential output port, the dual differential output port having a first differential input and a second differential input and configured to convert the differential input signals into single ended outputs; and converting the differential in-phase output signal to a single ended in-phase output signal and the differential quadrature phase output signal to a single ended-quadrature phase output signal, wherein the switches further include a first plurality of pairs of serially coupled switches coupled in parallel between the differential input port and the in-phase differential output port and a second plurality of pairs of serially coupled switches coupled in parallel between the differential input port and the quadrature-phase differential output port, and wherein the switches are configured to output both differential in-phase output signals to a first set of differential inputs of the dual differential load on a first and a third phase of the phased half duty cycle clocks and to output both differential quadrature-phase output signals to a second set of differential inputs of the dual differential load on a second and a fourth phase of the phased half duty cycle clocks being out of phase by ninety degrees from each adjacent phased half duty cycle clock.

7. The method of claim 6, wherein the switching of switches includes
in response to a first phase of the four phased half duty cycle clocks,
closing a first $1^{st}$ level switch and a first $2^{nd}$ level switch coupled in series to the first $1^{st}$ level switch to pass through a signal on a positive RF input terminal to a positive in-phase output terminal coupled into a first differential load, and
closing a third $1^{st}$ level switch and a fifth $2^{nd}$ level switch coupled in series to the third $1^{st}$ level switch to pass through a signal on a negative RF input terminal to a negative in-phase output terminal coupled into the first differential load;
in response to a second phase of the four phased half duty cycle clocks,
closing the first $1^{st}$ level switch and a second $2^{nd}$ level switch coupled in series to the first $1^{st}$ level switch to pass through a signal on a positive RF input terminal to a positive quadrature-phase output terminal coupled into a second differential load, and
closing the third $1^{st}$ level switch and a sixth $2^{nd}$ level switch coupled in series to the third $1^{st}$ level switch to pass through a signal on a negative RF input terminal to a negative quadrature-phase output terminal coupled into the second first differential load;
in response to a third phase of the four phased half duty cycle clocks,
closing a second $1^{st}$ level switch and a third $2^{nd}$ level switch coupled in series to the second $1^{st}$ level switch to pass through a signal on a positive RF input terminal to a negative in-phase output terminal coupled into the first differential load, and
closing a fourth $1^{st}$ level switch and a seventh $2^{nd}$ level switch coupled in series to the fourth $1^{st}$ level switch to pass through a signal on a negative RF input terminal to a positive in-phase output terminal coupled into the first differential load; and
in response to a fourth phase of the four phased half duty cycle clocks,
closing the second $1^{st}$ level switch and a fourth $2^{nd}$ level switch coupled in series to the second $1^{st}$ level switch to pass through a signal on a positive RF input terminal to a negative quadrature-phase output terminal coupled into the second differential load, and
closing the fourth $1^{st}$ level switch and an eighth $2^{nd}$ level switch coupled in series to the fourth $1^{st}$ level switch to pass through a signal on a negative RF input terminal to a positive quadrature-phase output terminal coupled into the second differential load.

8. The method of claim 7, wherein each of the switches is an n-channel field effect transistors (NFET) closed by the application of a high voltage level upon its gate terminal.

9. The method of claim 7, wherein each of the switches is a p-channel field effect transistors (PFET) closed by the application of a low voltage level upon its gate terminal.

10. The method of claim 7, wherein each of the switches is a p-channel field effect transistors (PFET) and an n-channel field effect transistors (NFET) coupled in parallel together, the PFET being closed by the application of a low voltage level upon its gate terminal and the NFET being closed by the application of a high voltage level upon its gate terminal.

11. The method of claim 6, wherein the switching of switches includes
in response to a first phase of the four phased half duty cycle clocks,
closing a first pair of switches coupled in series to pass through a signal on a positive RF input terminal to a positive in-phase output terminal coupled into a first differential load, and
closing a fifth pair of switches coupled in series to pass through a signal on a negative RF input terminal to a negative in-phase output terminal coupled into the first differential load;
in response to a second phase of the four phased half duty cycle clocks,
closing a second pair of switches coupled in series to pass through a signal on a positive RF input terminal to a positive quadrature-phase output terminal coupled into a second differential load, and
closing a sixth pair of switches coupled in series to pass through a signal on a negative RF input terminal to a negative quadrature-phase output terminal coupled into the second first differential load;
in response to a third phase of the four phased half duty cycle clocks,
closing a third pair of switches coupled in series to pass through a signal on a positive RF input terminal to a negative in-phase output terminal coupled into the first differential load, and
closing a seventh pair of switches coupled in series to pass through a signal on a negative RF input terminal to a positive in-phase output terminal coupled into the first differential load; and
in response to a fourth phase of the four phased half duty cycle clocks,
closing a fourth pair of switches coupled in series to pass through a signal on a positive RF input terminal to a negative quadrature-phase output terminal coupled into the second differential load, and
closing an eighth pair of switches coupled in series to pass through a signal on a negative RF input terminal to a positive quadrature-phase output terminal coupled into the second differential load.

12. The method of claim 11, wherein each of the switches is a first type of transistor closed by the application of a high voltage level upon its control terminal and opened by the application of a low voltage level upon its control terminal.

13. The method of claim 12, wherein each of the switches is an n-channel field effect transistor.

14. The method of claim 11, wherein each of the switches is a second type of transistor closed by the application of a low voltage level upon its control terminal and opened by the application of a high voltage level upon its control terminal.

15. The method of claim 13, wherein each of the switches is a p-channel field effect transistor.

16. The method of claim 11, wherein each of the switches is a transfer gate with a first type of transistor and a second type of transistor coupled in parallel together, the first type of transistor being closed by the application of a high voltage level upon its control terminal and the second type of transistor being closed by the application of a low voltage level upon its control terminal.

17. An apparatus comprising:
means for generating four phased half duty cycle clocks wherein each of the four phased half duty cycle clocks are out of phase by ninety degrees from each adjacent phased half duty cycle clock;
means for convolving a differential input signal with the four phased half duty cycle clocks to generate a differential in-phase output signal and a differential quadrature-phase output signal on a dual differential output port, the dual differential output port having a first differential input and a second differential input and configured to convert the differential input signals into single ended outputs;
means for coupling the four phased half duty cycle clocks into the means for convolving; and
means for converting the differential in-phase output signal to a single ended in-phase output signal and the differential quadrature phase output signal to a single ended-quadrature phase output signal,
wherein the means for convolving a differential input signal further includes a first plurality of pairs of serially coupled switches coupled in parallel between the differential input port and the in-phase differential output port and a second plurality of pairs of serially coupled switches coupled in parallel between the differential input port and the quadrature-phase differential output port, and
wherein the means for convolving a differential input signal includes means for outputting both differential in-phase output signals to a first set of differential inputs of the dual differential load on a first and a third phase of the phased half duty cycle clocks and a means for outputting both differential quadrature-phase output signals to a second set of differential inputs of the dual differential load on a second and a fourth phase of the phased half duty cycle clocks being out of phase by ninety degrees from each adjacent phased half duty cycle clock.

18. The apparatus of claim 17, wherein the means for coupling the four phased half duty cycle clocks are conductive traces in one or more layers of an integrated circuit.

19. The apparatus of claim 17, wherein the means for convolving is a four phase half duty cycle mixer including switches that are switched in response to the four phased half duty cycle clocks.

20. The apparatus of claim 17, wherein the means for generating the four phased half duty cycle clocks is a clock generator.

* * * * *